(12) United States Patent
Liao et al.

(10) Patent No.: US 6,385,097 B1
(45) Date of Patent: May 7, 2002

(54) METHOD FOR TRACKING METAL BIT LINE COUPLING EFFECT

(75) Inventors: Kuo-Yu Liao, Pan-Chiao; Han-Sung Chen, Hsin-Chu; Chun-Hsiung Hung, Hsin-Chu; Ho-Chun Liou, Hsin-Chu, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/805,192

(22) Filed: Mar. 14, 2001

(51) Int. Cl.[7] ................................................. G11C 7/00
(52) U.S. Cl. ............................. 365/189.07; 365/189.09
(58) Field of Search ........................ 365/189.07, 189.09

(56) References Cited

U.S. PATENT DOCUMENTS 5,724,295 A * 3/1998 Beiley et al. ................ 365/222
5,724,296 A * 3/1998 Jang ............................ 365/222

FOREIGN PATENT DOCUMENTS

JP            0053790    *  3/1988  ............ G11C/11/34

OTHER PUBLICATIONS

Betty Prince, "Semiconductor Memories", 1983, Wiley, 2nd edition pp. 550–551.*

* cited by examiner

*Primary Examiner*—Trong Phan
*Assistant Examiner*—M. Tran

(57) ABSTRACT

A method for tracking metal bit line coupling effect in sensing a signal received from an array cell within a memory array is disclosed. The method includes that a reference unit with a reference cell is provided, wherein the reference unit induces coupling effect. Then, the memory array and the reference unit are charged to generate a cell signal having coupling effect and a reference signal having coupling effect. Next, a sensing signal is generated from the difference of the cell signal and the reference signal, whereby the coupling effect is compensated. In the read-out operation of the present invention, because of the closeness of two adjacent metal bit lines, the coupling effect is induced in both memory array and reference unit at the same time, so that the coupling effect is compensated. Therefore, precise read-out operation of data stored in a memory cell is made possible, and the reliability of the device is improved by the present invention.

14 Claims, 3 Drawing Sheets

METHOD FOR TRACKING METAL BIT LINE COUPLING EFFECT

BACKGROUND OF THE INVENTION

1. Field of the Invention

The present invention generally relates to a method for sensing memory devices, and more particularly to a method for tracking metal bit line coupling effect.

2. Description of the Prior Art

Memory devices, such as random access memory (RAM), read-only only memory (ROM), non-volatile memory (NVM) and the like, are known in the art. Particularly, memory devices for non-volatile storage of information are currently in widespread use today, being used in a myriad of applications. These devices provide an indication of the data which is stored therein by providing an output electric signal. A device called a sense amplifier is used for detecting the signal and determining the logical content thereof.

In general, sense amplifiers determine the logical value stored in a cell by comparing the output of the cell with a reference signal. If the output is above the reference signal, the cell is determined to be erased (with a logical value of 1), and if the output is below the reference signal, the cell is determined to be programmed (with a logical value of 0). The reference signal level is typically set as a voltage level between the expected erased and programmed voltage levels which is sufficiently far from both expected voltage levels so that noise on the output will not cause false results.

Memory devices such as read-only memories ordinarily comprise an array of memory cells. Each column in the array is connected to a bit line, and each row in the array is connected to a word line. Data is read by placing electric signals on the appropriate word lines and bit lines via address decoders. In a read procedure, one of the two selected bit lines is defined as a source and the other is defined as a drain from which the content of the cell will be read. The read-out operation is a process of comparing amounts of currents flowing through a reference cell and a memory cell by using a sense amplifier after making currents flow through the reference cell and a selected memory cell and outputting data output from the sense amplifier to a data buffer.

However, as the density of integration getting higher and higher, the distance between adjacent bit lines is becoming closer and closer. Coupling occurred due to capacitance between adjacent bit lines is becoming more and more significant and non-negligible. Accordingly, the portion of the relevant data signal (programmed or erased) within the overall detected signal is significantly small. The detected signal is usually less than 100 mV, but the variation of signal caused by the bit line coupling is within the range of several 10 s mV. To reduce the coupling between adjacent bit lines, no matter by extending the distance between adjacent bit lines, which also reduces the density of integrated circuit, or by staggering the operation time of adjacent bit lines, which prolongs the operation time, is a trade off. Hence, the recurring task in memory sensing scheme is to track the coupling effect between adjacent bit lines.

SUMMARY OF THE INVENTION

In accordance with the present invention, a method is provided for tracking metal bit line coupling effect. The present invention substantially prevents from false results due to bit line coupling in the read-out operation of a memory device and reduces bit line coupling effect without any trade off of integrated density and time prolongation.

It is another object of this invention that a method for sensing a signal received from an array cell within a memory array, which induces coupling effect, is provided.

It is a further object of this invention that a method is provided for inducing coupling effect in a reference unit.

It is still another object of this invention that a method is provided for compensating the coupling effect, which is caused by adjacent bit lines, by generating metal bit line coupling in the reference unit.

There is therefore provided, in accordance with a preferred embodiment of the present invention, a method for tracking metal bit line coupling effect in the application of sensing a signal received from an array cell within a memory array which induces coupling effect. In the read-out operation of the present invention, because the closeness of two adjacent metal bit lines, coupling effect is induced in both memory array and reference unit at the same time, so that coupling effect is compensated. The method comprises that a reference unit with a reference cell is provided, wherein the reference unit induces coupling effect. Then, the memory array and the reference unit are charged to generate a cell signal having coupling effect and a reference signal having coupling effect. Next, a sensing signal is generated from the difference of the cell signal and the reference signal, whereby the coupling effect is compensated. Furthermore, the step of generating the sensing signal from the difference of the cell signal and reference signal includes the steps of amplifying the reference signal and the cell signal, generating a difference signal representing the difference between the amplified reference signal and the amplified cell signal, and converting the difference signal to a logical signal. Therefore, precise read-out operation of data stored in a memory cell is made possible, and the reliability of the device is improved by the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
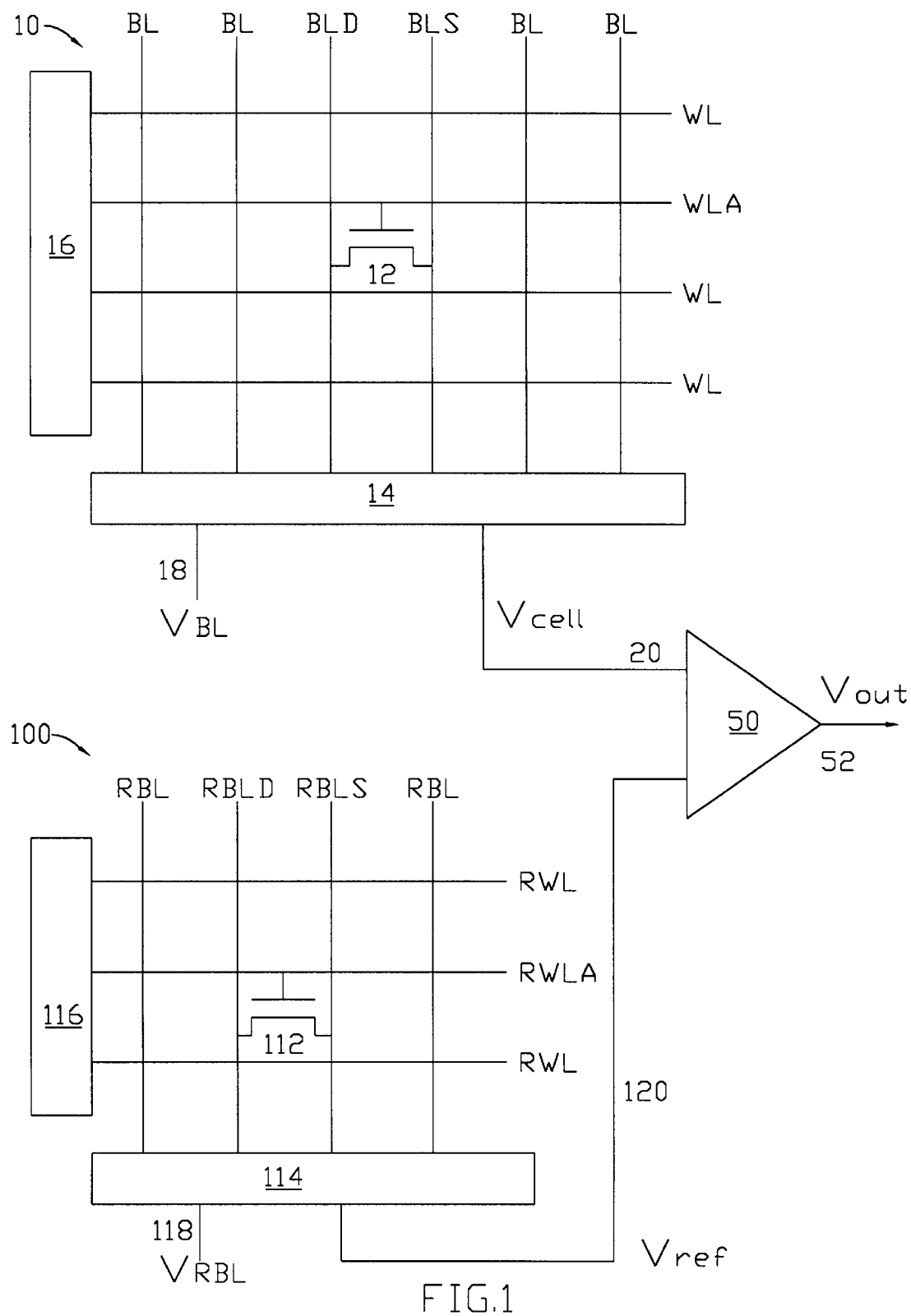
FIG. 1 is a schematic illustration of a memory cell and a sense amplifier, constructed and operated in accordance with a preferred embodiment.

In a preferred embodiment, a method for tracking metal bit line coupling effect in sensing a signal received from an array cell within a memory array, which induces coupling effect, is disclosed. Referring to FIG. 1, which is a schematic illustration of a memory array 10, a reference unit 100, and a sense amplifier 50. The memory has a multiplicity of cells, like a cell 12 shown in FIG. 1, organized into rows and columns. The gates of a single row of cells are connected to a word line (WL), the sources of a column of cells are connected to a bit line (BL), as are drains of the column. It is conventional that the drains and sources of the memory cell transistors are interchangeable. It is noted that the term "bit line" is used herein to mean a metal bit line along which current is carried. All the bit lines BL are connected to Y decoder 14, and all the word lines WL are connected to X decoder 16. FIG. 1 shows the cell 12 to be read which is connected between two bit lines, labeled BLD and BLS, with its gate connected to a word line WLA.

Figure 2:
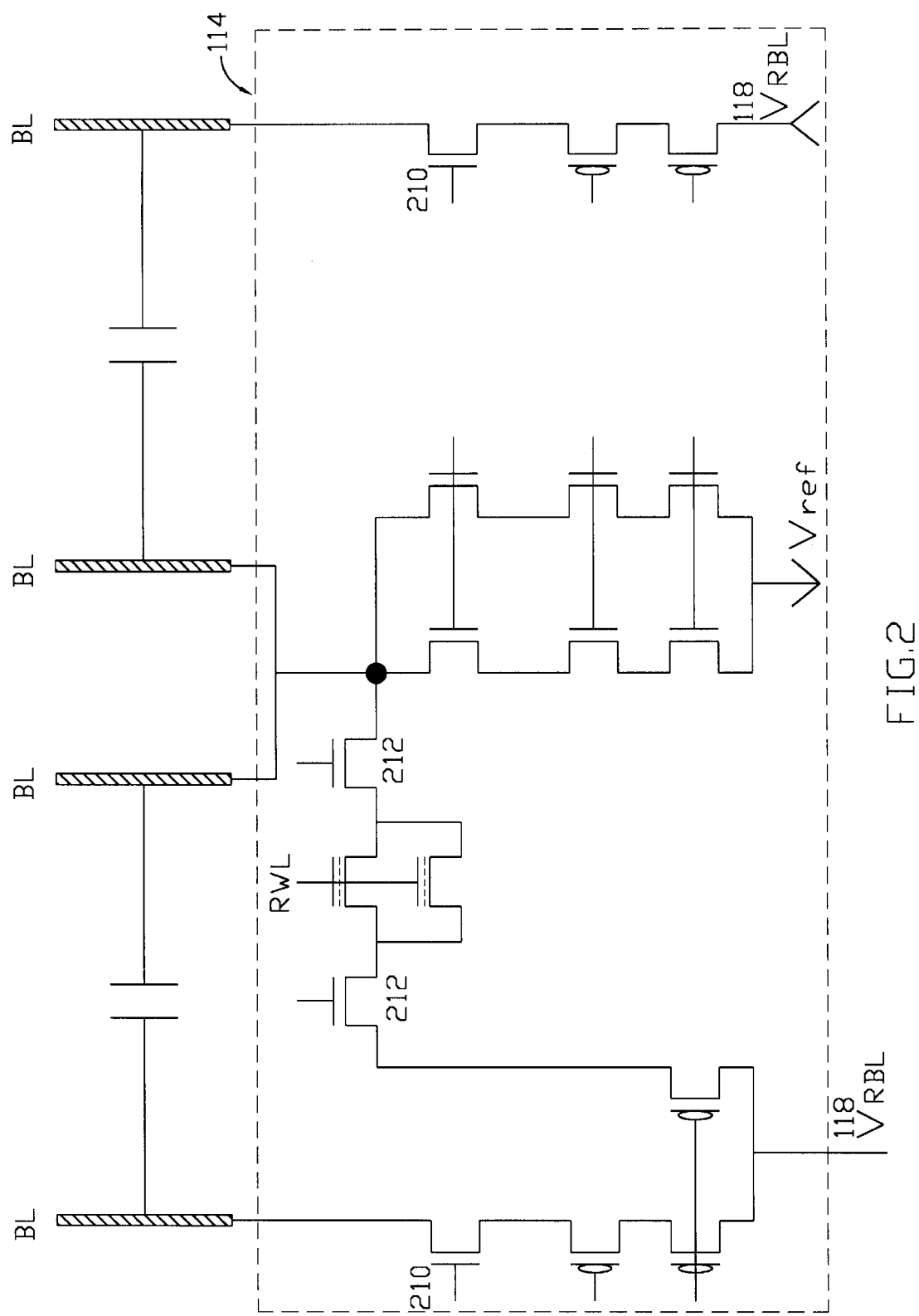
FIG. 2 is a schematic illustration of a portion of reference Y decoder.

The method includes that a reference unit 100 with a reference cell 112 is provided, wherein the reference unit 100 induces coupling effect. The reference unit 100 has a multiplicity of cells, like cell 112 shown in FIG. 1, organized into rows and columns similar to the structure of the memory array. The gates of a single row of cells are connected to a reference word line (RWL), the sources of a column of cells are connected to a reference bit line (RBL), as are drains of the column. All the bit lines RBL are connected to reference Y decoder 114, and all the word lines RWL are connected to a reference X decoder 16. FIG. 1 shows the cell 112 to be read which is connected between two bit lines, labeled RBLD and RBLS, with its gate connected to a word line RWLA. Reference Y decoder 114, shown in the FIG. 2, has a column select transistor control 210, which receives a control signal indicated if coupling effect is induced in the array cell 12, to decide if coupling effect is induced in the reference unit. The reference select transistor 212 decides which reference cell 112 is selected.

Then, the array and the reference unit are charged to generate a cell signal $V_{cell}$ having coupling effect and a reference signal $V_{ref}$ having coupling effect. During sensing, Y decoder 14 connects drain bit line BLD to supply line 18 having a source voltage $V_{BL}$, thereon and source bit line BLS to sensing line 20. At the same time, reference Y decoder 114 connects drain bit line RBLD to supply line 118 having a source voltage $V_{RBL}$, thereon and source bit line RBLS to sensing line 120. When a voltage $V_{BL}$ is applied to supply line 18, cell 12 responds and the voltage on sensing line 20 will change accordingly, to be measured by sense amplifier 50. When the voltage $V_{BL}$ is applied to supply line 18, a voltage $V_{RBL}$ is applied to the supply line 118, the reference cell 112 responds and the voltage on sensing line 120 will change accordingly, to be measured also by the sense amplifier 50. The voltages $V_{BL}$ and $V_{RBL}$ can be the same source voltage and same magnitude.

Figure 3A:
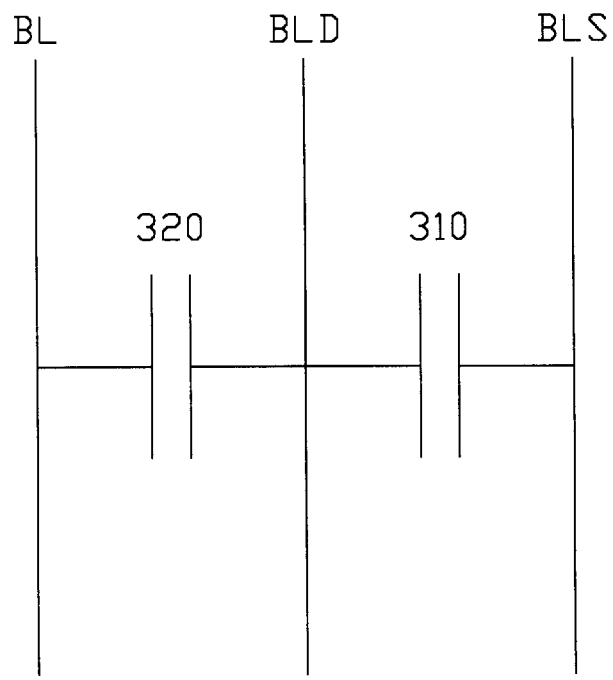
FIGS. 3A to 3B are schematic representations of metal bit line coupling effect.
Figure 3B:
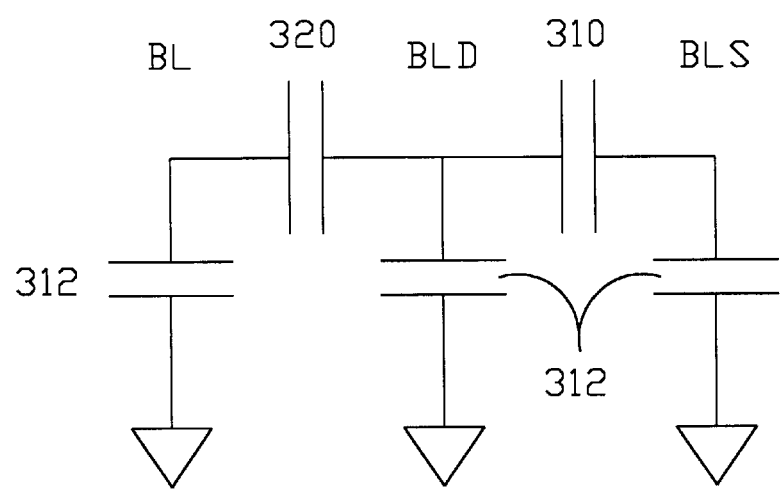

FIG. 3A is a schematic illustration of metal bit line coupling effect. The middle metal bit line is the active bit line BLD, which is activated to cause adjacent bit lines, BLS and BL, inducing coupling voltage, respectively. When the active metal bit line BLD has a variation in voltage, $\Delta V_{BL\_swing}$, coupling effect is induced to cause a signal variation $\Delta V_{coupling}$ in sensing voltage of adjacent metal bit line BLS. The voltage variation caused by coupling effect ($\Delta V_{coupling}$) is determined according to the following equation:

$$\Delta V_{coupling} \approx (C_{BLCS} \times V_{BL\_swing})/(C_{metal} + C_{BLT} + C_{YMUX} + C_{BLCS} + C_{BLC})$$

where $C_{BLCS}$ 310 is the capacitance induced by the effect of the active bit line BLD on the source metal bit line BLS, $C_{BLC}$ 320 is the capacitance induced by the effect of the active bit line BLD on the metal bit line BL, $\Delta V_{BL\_swing}$ is the swing voltage of BLD, $C_{metal}$ is the capacitance of bit line material, $C_{BLT}$ is the capacitance of block transistor, and $C_{YMUX}$ is the capacitance of Y decoder. The influence of $C_{metal}$, $C_{BLT}$, and $C_{YMUX}$ is indicated as a capacitor 312 in FIG. 3B. That is to say, for a memory array with adjacent metal bit lines of a distance about 0.7 μm, the $C_{BLCS}$ is about 0.18 p (pico, $10^{-12}$) F (farad), the $C_{BLC}$ is about 0.18 p F, and the influence of $C_{metal}$, $C_{BLT}$, and $C_{YMUX}$ is a total of about 2.4 p F, wherein $C_{metal}$, $C_{BLT}$, and $C_{YMUX}$ is 1.0 p, 0.9 p, and 0.5 p F, respectively. When the cell is erased, the swing voltage $\Delta V_{BL\_swing\_LVT}$ is about 0.4 volts (V). Thus, $$\Delta V_{coupling\_LVT} \approx (0.18\ p \times 0.4\ V)/(2.4\ p + 0.18\ p + 0.18\ p)$$

$$\approx 0.026\ V$$

$$\approx 26\ mV$$

when the cell is erased, the voltage variation caused by coupling effect $\Delta V_{coupling\_LVT}$ is about 26 mV. When the cell is programmed, the swing voltage $\Delta V_{BL\_swing\_HVT}$ is about 0.7 V. Thus, $$\Delta V_{coupling\_HVT} \approx (0.18\ p \times 0.7\ V)/(2.4\ p + 0.18\ p + 0.18\ p)$$

$$\approx 0.046\ V$$

$$\approx 46\ mV$$

when the cell is programmed, the voltage variation caused by coupling effect $\Delta V_{coupling\_HVT}$ is about 46 mV.

The reference unit 100, during sensing, is by use of a coupling capacitor to induce coupling effect which generates a voltage variation $\Delta V_{coupling\_REF}$. The swing voltage of reference unit is simulated that of the programmed cell, the $\Delta V_{BL\_swing\_REF}$ is about 0.7 V. The method is also by adding an extra non-coupling capacitor in the reference unit to make the voltage variation $\Delta V_{coupling\_REF}$ between the erased and programmed voltage variations. The extra coupling capacitance is about 0.8 p F. Thus, $$\Delta V_{coupling\_REF} \approx (0.18\ p \times 0.7\ V)/(2.4\ p + 0.18\ p + 0.18\ p)$$

$$\approx 0.035\ V$$

$$\approx 35\ mV$$

the voltage variation of reference unit $\Delta V_{coupling\_REF}$ is about 35 mV, which is between the erased and programmed voltage variations, 26 mV and 46 mV.

Next, a sensing signal $V_{out}$ is generated from the difference of the cell signal $V_{cell}$ and the reference signal $V_{ref}$ by sense amplifier 50. Sense amplifier 50 is an amplifying comparator. Amplifying comparator 50 receives a voltage $V_{cell}$ on sensing line 20 and a voltage $V_{ref}$ on sensing line 120 from reference unit, and produces a sense data output signal $V_{out}$ therefrom. The cell signal $V_{cell}$ has a contribution of coupling effect, $\Delta V_{coupling\_(LVT,\ HVT)}$, and the reference signal $V_{ref}$ has a contribution of coupling effect, $\Delta V_{coupling\_REF}$, whereby the reference window between erased and programmed is kept, and the coupling effect compensated. The step of generating the sensing signal $V_{out}$ from the difference of the cell and reference signals includes amplifying the reference signal $V_{ref}$ and the cell signal $V_{cell}$, generating a difference signal representing the difference between the amplified reference signal and the cell signal, and converting the difference signal to a logical signal. Therefore, precise read-out operation of data stored in a memory cell is made possible, and the reliability of the device is improved by the present invention.

Although specific embodiments have been illustrated and described, it will be obvious to those skilled in the art that various modifications may be made without departing from what is intended to be limited solely by the appended claims.

What is claimed is:

1. A method for sensing a signal received from an array cell within a memory array which induces an expected signal variation due to coupling effect, said method comprising:

providing a reference unit with a reference cell, wherein said reference unit induces coupling effect;

charging said array and said reference unit, thereby to generate a cell signal having coupling effect and a reference signal having coupling effect; and generating a sensing signal from the difference of said cell signal and said reference signal, whereby coupling effect is compensated by reducing the difference caused by coupling effect in both said cell signal and said reference signal.

2. The method according to claim 1, wherein said reference unit comprises a decoder to address said reference cell.

3. The method according to claim 1, wherein said reference unit comprises a coupling capacitor to induce coupling effect.

4. The method according to claim 3, wherein said coupling capacitor generates a signal variation.

5. The method according to claim 1, wherein said step of generating said sensing signal from the difference of said cell signal and said reference signal comprises:

amplifying said reference signal and said cell signal;

generating a difference signal representing the difference between said amplified reference signal and said amplified cell signal; and converting said difference signal to a logical signal.

6. A method for sensing a signal received from an array cell within a read-only memory array which induces a first signal variation due to coupling effect, said method comprising:

providing a reference unit with a reference cell, wherein said reference unit induces coupling effect;

charging said array and said reference unit, thereby to generate a cell signal having said first signal variation and a reference signal having a second signal variation;

generating a difference signal from the difference of said cell signal and said reference signal; and converting said difference signal to a logical signal, whereby coupling effect is compensated by reducing the difference caused by coupling effect in both said cell signal and said reference signal.

7. The method according to claim 6, wherein said reference unit comprises a decoder to address said reference cell.

8. The method according to claim 6, wherein said reference unit comprises a coupling capacitor to generate said second signal variation.

9. The method according to claim 6, wherein said step of generating said difference signal from the difference of said cell signal and said reference signal comprises:

amplifying said reference signal and said cell signal; and generating said difference signal representing the difference between said amplified reference signal and said amplified cell signal.

10. A method for tracking metal bit line coupling effect in sensing a signal received from an array cell within a read-only memory device having a first signal variation, said method comprising:

providing a reference unit with a reference cell, wherein said reference unit induces a second signal variation by a coupling capacitor due to coupling effect;

charging said array and said reference unit, thereby to generate a cell signal having said first signal variation and a reference signal having said second signal variation;

comparing said cell signal and said reference signal to generate a sensing signal from the difference of said cell signal and said reference signal;

judging said sensing signal to determine a logical signal of said sensing signal; and converting said sensing signal to said logical signal, whereby coupling effect is compensated by reducing the difference caused by coupling effect in both said cell signal and said reference signal.

11. The method according to claim 10, wherein said reference unit comprises a decoder to address said reference cell.

12. The method according to claim 10, wherein said step of comparing said cell signal and said reference signal to generate said sensing signal from the difference of said cell signal and said reference signal comprises:

amplifying said reference signal and said cell signal; and generating said sensing signal representing the difference between said amplified reference signal and said amplified ell signal.

13. The method according to claim 10, wherein said step of judging said sensing signal comprises determining said logical signal to be erased, wherein said cell signal is greater than said reference signal.

14. The method according to claim 10, wherein said step of judging said sensing signal comprises determining said logical signal to be programmed, wherein said cell signal is smaller than said reference signal.

* * * * *